US012782818B2

(12) United States Patent
Klinkhamer et al.

(10) Patent No.: US 12,782,818 B2
(45) Date of Patent: Nov. 3, 2026

(54) INTERFACE DEFINITION FOR LITHOGRAPHIC APPARATUS

(71) Applicant: ASML NETHERLANDS B.V., Veldhoven (NL)

(72) Inventors: Jacob Fredrik Friso Klinkhamer, Tilburg (NL); Michel Alphons Theodorus Van Hinsberg, Eindhoven (NL)

(73) Assignee: ASML NETHERLANDS, Veldhoven (NL)

( * ) Notice: Subject to any disclaimer, the term of this patent is extended or adjusted under 35 U.S.C. 154(b) by 626 days.

(21) Appl. No.: 18/274,990

(22) PCT Filed: Dec. 20, 2021

(86) PCT No.: PCT/EP2021/086729
§ 371 (c)(1),
(2) Date: Jul. 28, 2023

(87) PCT Pub. No.: WO2022/179739
PCT Pub. Date: Sep. 1, 2022

(65) Prior Publication Data
US 2024/0111214 A1 Apr. 4, 2024

(30) Foreign Application Priority Data

Feb. 25, 2021 (EP) .................................... 21159201
Mar. 16, 2021 (EP) .................................... 21162871

(51) Int. Cl.
*G03F 7/20* (2006.01)

(52) U.S. Cl.
CPC .................................... *G03F 7/20* (2013.01)

(58) Field of Classification Search
None
See application file for complete search history.

(56) References Cited

U.S. PATENT DOCUMENTS 12,260,157 B1 * 3/2025 Satzinger ................ G06F 30/20
12,321,081 B2 * 6/2025 Yu ........................... G02F 1/365
(Continued)

FOREIGN PATENT DOCUMENTS

WO 2020234028 11/2020
WO 2021/028126 2/2021

OTHER PUBLICATIONS

International Search Report and Written Opinion issued in corresponding PCT Patent Application No. PCT/EP2021/086729, dated Apr. 7, 2022.

(Continued)

*Primary Examiner* — Hua Lu
(74) *Attorney, Agent, or Firm* — Pillsbury Winthrop Shaw Pittman, LLP

(57) ABSTRACT

A method for representing control parameter data for controlling a lithographic apparatus during a scanning exposure of an exposure field on a substrate, the method including: obtaining a set of periodic base functions, each base function out of the set of periodic base functions having a different frequency and a period smaller than a dimension associated with the exposure field across which the lithographic apparatus needs to be controlled; obtaining the control parameter data; and determining a representation of the control parameter data using the set of periodic base functions.

20 Claims, 2 Drawing Sheets

(56) References Cited

U.S. PATENT DOCUMENTS

| | | | | |
|---|---|---|---|---|
| 2003/0011894 | A1* | 1/2003 | Schuster | G02B 13/143 359/731 |
| 2003/0043354 | A1* | 3/2003 | Butler | G03F 7/70358 355/53 |
| 2004/0129900 | A1* | 7/2004 | Den Boef | G03F 9/7046 250/559.3 |
| 2004/0207928 | A1* | 10/2004 | Schultz | G02B 13/143 359/649 |
| 2004/0232354 | A1* | 11/2004 | Singer | B82Y 10/00 250/492.2 |
| 2005/0170296 | A1* | 8/2005 | Jansen | G03F 7/70066 430/394 |
| 2006/0114437 | A1* | 6/2006 | Akhssay | G03F 7/70258 355/55 |
| 2006/0238761 | A1* | 10/2006 | Lin | G03F 7/705 356/401 |
| 2007/0030948 | A1* | 2/2007 | Singer | G03F 7/70083 378/146 |
| 2008/0159679 | A1* | 7/2008 | Sigalas | G02B 6/13 385/2 |
| 2011/0196646 | A1* | 8/2011 | Mos | G03F 7/705 355/77 |
| 2012/0008127 | A1* | 1/2012 | Tel | G03F 7/70516 355/77 |
| 2014/0235463 | A1* | 8/2014 | Rothberg | G01N 27/4145 506/38 |
| 2016/0334713 | A1* | 11/2016 | Slotboom | G03F 7/70141 |
| 2017/0100332 | A1* | 4/2017 | Tonkin | A61K 47/34 |
| 2018/0252998 | A1* | 9/2018 | Ten Berge | G03F 1/72 |
| 2018/0259859 | A1* | 9/2018 | Kant | G03F 7/705 |
| 2018/0299770 | A1* | 10/2018 | Ten Berge | G03F 1/36 |
| 2018/0307135 | A1* | 10/2018 | Ten Berge | G03F 1/72 |
| 2018/0314149 | A1* | 11/2018 | Mulkens | G03F 1/72 |
| 2018/0314168 | A1* | 11/2018 | Van Haren | G03F 1/70 |
| 2018/0322237 | A1* | 11/2018 | Ten Berge | G03F 1/70 |
| 2018/0364582 | A1* | 12/2018 | Slotboom | G03F 7/70141 |
| 2020/0135427 | A1* | 4/2020 | Vystavel | H01J 37/304 |
| 2020/0166854 | A1* | 5/2020 | Yagubizade | G03F 7/705 |
| 2023/0258958 | A1* | 8/2023 | Esfandiarijahromi | G02C 7/022 351/159.01 |
| 2026/0161019 | A1* | 6/2026 | Esfandiarijahromi | G02C 7/028 |

OTHER PUBLICATIONS

Office Action issued in corresponding Japanese Patent Application No. 2023-545777, dated Oct. 8, 2025.

* cited by examiner

| OVERLAY X Parameters | | | | | | | | | |
|---|---|---|---|---|---|---|---|---|---|
| | $Y^0$ | $Y^1$ | $Y^2$ | $Y^3$ | $Y^4$ | $Y^5$ | sin freq=2.5 | sin freq=3.0 | sin freq=3.5 |
| $X^0$ | 1 | 5 | 11 | 19 | 29 | 41 | 55 | 71 | 89 |
| $X^1$ | 3 | 9 | 17 | 27 | 39 | 53 | 69 | 87 | 107 |
| $X^2$ | 7 | 15 | 25 | 37 | 51 | 67 | 85 | 105 | 127 |
| $X^3$ | 13 | 23 | 35 | 49 | 65 | 83 | 103 | 125 | 149 |
| $X^4$ | 21 | 33 | 47 | 63 | 81 | 101 | 123 | 147 | 173 |
| sin freq=2.0 | 31 | 45 | 61 | 79 | 99 | 121 | 145 | 171 | 199 |
| sin freq=2.5 | 43 | 59 | 77 | 97 | 119 | 143 | 169 | 197 | 227 |
| sin freq=3.0 | 57 | 75 | 95 | 117 | 141 | 167 | 195 | 225 | 257 |
| sin freq=3.5 | 73 | 93 | 115 | 139 | 165 | 193 | 223 | 255 | 289 |
| sin freq=4.0 | 91 | 113 | 137 | 163 | 191 | 221 | 253 | 287 | 323 |
| OVERLAY Y Parameters | | | | | | | | | |
| | $Y^0$ | $Y^1$ | $Y^2$ | $Y^3$ | $Y^4$ | $Y^5$ | sin freq=2.5 | sin freq=3.0 | sin freq=3.5 |
| $X^0$ | 2 | 4 | 8 | 14 | 22 | 32 | 44 | 58 | 74 |
| $X^1$ | 6 | 10 | 16 | 24 | 34 | 46 | 60 | 76 | 94 |
| $X^2$ | 12 | 18 | 26 | 36 | 48 | 62 | 78 | 96 | 116 |
| $X^3$ | 20 | 28 | 38 | 50 | 64 | 80 | 98 | 118 | 140 |
| $X^4$ | 30 | 40 | 52 | 66 | 82 | 100 | 120 | 142 | 166 |
| sin freq=2.0 | 42 | 54 | 68 | 84 | 102 | 122 | 144 | 168 | 194 |
| sin freq=2.5 | 56 | 70 | 86 | 104 | 124 | 146 | 170 | 196 | 224 |
| sin freq=3.0 | 72 | 88 | 106 | 126 | 148 | 172 | 198 | 226 | 256 |

INTERFACE DEFINITION FOR LITHOGRAPHIC APPARATUS

CROSS-REFERENCE TO RELATED APPLICATIONS

This application is the U.S. national phase entry of PCT Patent Application No. PCT/EP2021/086729 which was filed on Dec. 20, 2021, which claims priority of European Patent Application No. 21159201.9 which was filed on Feb. 25, 2021 and of European Patent Application No. 21162871.4 which was filed on Mar. 16, 2021 which are incorporated herein in their entireties by reference.

FIELD OF THE INVENTION

The present invention relates to a control interface, in particular to control interface parameters associated with corresponding base functions for representing a control profile for controlling a lithographic apparatus during scanning (exposure) operation.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies, the target portion often referred to as a “field” or “exposure field”) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Each target portion is typically exposed by the lithographic apparatus in a scanning fashion (e.g. the reticle and substrate are moved during the exposure such that during one scanning operation one complete exposure field is exposed).

In lithographic processes it is important to control the actuators of the lithographic apparatus, in particular a substrate stage position and imaging properties of a projection lens used in transferring the pattern to said target portion during said scanning operation. To be able to control overlay for example state of the art lithographic apparatuses are provided with a control interface based on a polynomial definition of a desired parameter (typically overlay or positioning of a pattern) distribution across the field. A well-known example of such a polynomial definition is the so-called k-parameter based interface, wherein each k-parameter corresponds to a combination of polynomials associated with a certain geometrical deformation (e.g. magnification, pincushion etc.). Modern lithographic apparatuses became increasingly capable of controlling at higher resolutions (e.g. smaller spatial scales), so also their control interface definition needed to be adapted to this higher resolution control. So far this was achieved by incorporating increasingly higher order polynomial terms to be able to keep up with the enhanced control capabilities. For example the set of usable k-parameters has been extended significantly the past decade. However the use of High Order (HO) polynomials has a distinct disadvantage for control; when representing or fitting (overlay) parameter data using these HO polynomials the values of the parameter at the edge of the field may become instable (blow up), an effect often referred to as “Runge’s effect”.

SUMMARY OF THE INVENTION

It is an objective of the invention to provide a control interface definition which is better equipped to represent parameter data at a high resolution (e.g. small spatial scale) and at the same time being less susceptible to instable behavior at the edge of the field across which the parameter data is distributed.

According to a first aspect of the invention, there is provided a method for representing control parameter data for controlling a lithographic apparatus during a scanning exposure of an exposure field on a substrate, the method comprising: obtaining a set of periodic base functions, each base function out of said set of periodic base functions having a different frequency and a period smaller than a dimension associated with the exposure field across which the lithographic apparatus needs to be controlled; obtaining the control parameter data; and determining a representation of said control parameter data using the set of periodic base functions.

By representing the control parameter data using periodic functions having different periods and/or frequencies, all periods being smaller than a dimension of the field, a high resolution control interface is provided which is not prone to Runge’s effect.

Optionally the representation of the control parameter data may be further used to configure or control the lithographic apparatus.

Preferably the method further comprises obtaining a set of polynomial base functions, each polynomial base function having an order lower than required to represent the control parameter data and further using said set of polynomial base functions together with said set of periodic base function in determining the representation of the control parameter data.

Preferably the set of periodic base functions are all based on a sine function defined across the exposure field of the substrate.

Preferably the set of periodic base functions are defined as two-dimensional functions in a first (X) and a second (Y) coordinate of the exposure field on the substrate.

Preferably the set of polynomial base functions are associated with combinations of polynomials associated with k-parameters.

Preferably the set of periodic base functions comprise at least a first sine function having a period in the first coordinate which is half the dimension of the exposure field in the first coordinate and a period in the second coordinate which is 40% of the dimension of the exposure field in the second coordinate.

Preferably the set of periodic base functions comprise at least a second sine function having a period in the first coordinate which is one quarter of the dimension of the exposure field in the first coordinate and a period in the second coordinate which is about 30% of the dimension of the exposure field in the second coordinate.

Preferably the set of polynomial base functions have a maximum order of 4 in the first coordinate and a maximum order of 5 in the second coordinate.

Preferably the combined set $f(x)$ of periodic and polynomial base functions associated with the first coordinate is represented by the following formula:

$$f(x)=c_0+c_1x^1+c_2x^2+c_3x^3+c_4x^4-c_5\sin(2\pi(1-x))-c_6\sin(2.5\pi(1-x))-c_7\sin(3\pi(1-x))-c_8\sin(3.5\pi(1-x))-c_9\sin(4\pi(1-x)),$$

wherein c0-c9 are the control interface parameters associated with the first coordinate. Preferably the combined set f(y) of periodic and polynomial base functions associated with the second coordinate is represented by the following formula:

$$f(y)=c'_0+c'_1y^1+c'_2y^2+c'_3y^3+c'_4y^4+c'_5y^5-c'_6\sin(2.5\pi(1-y))--c'_7\sin(3\pi(1-y))-c'_8\sin(3.5\pi(1-x))$$

wherein c'0-c'8 are the control interface parameters associated with the second coordinate.

According to a second aspect of the invention, there is provided a device manufacturing method comprising: representing the control parameter data according to the method of the first aspect and subsequently controlling the lithographic apparatus during patterning the exposure field of the substrate using said representation of the control parameter data.

According to a third aspect of the invention, there is provided a computer program that, when executed by a computing system, causes the computing system to perform the method of the first aspect.

According to a fourth aspect of the invention, there is provided a computer readable medium carrying instructions that, when executed by a computing system, causes the computing system to perform the method of the first aspect.

According to a fifth aspect of the invention, there is provided a lithographic apparatus configured to implement the method of the first aspect.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
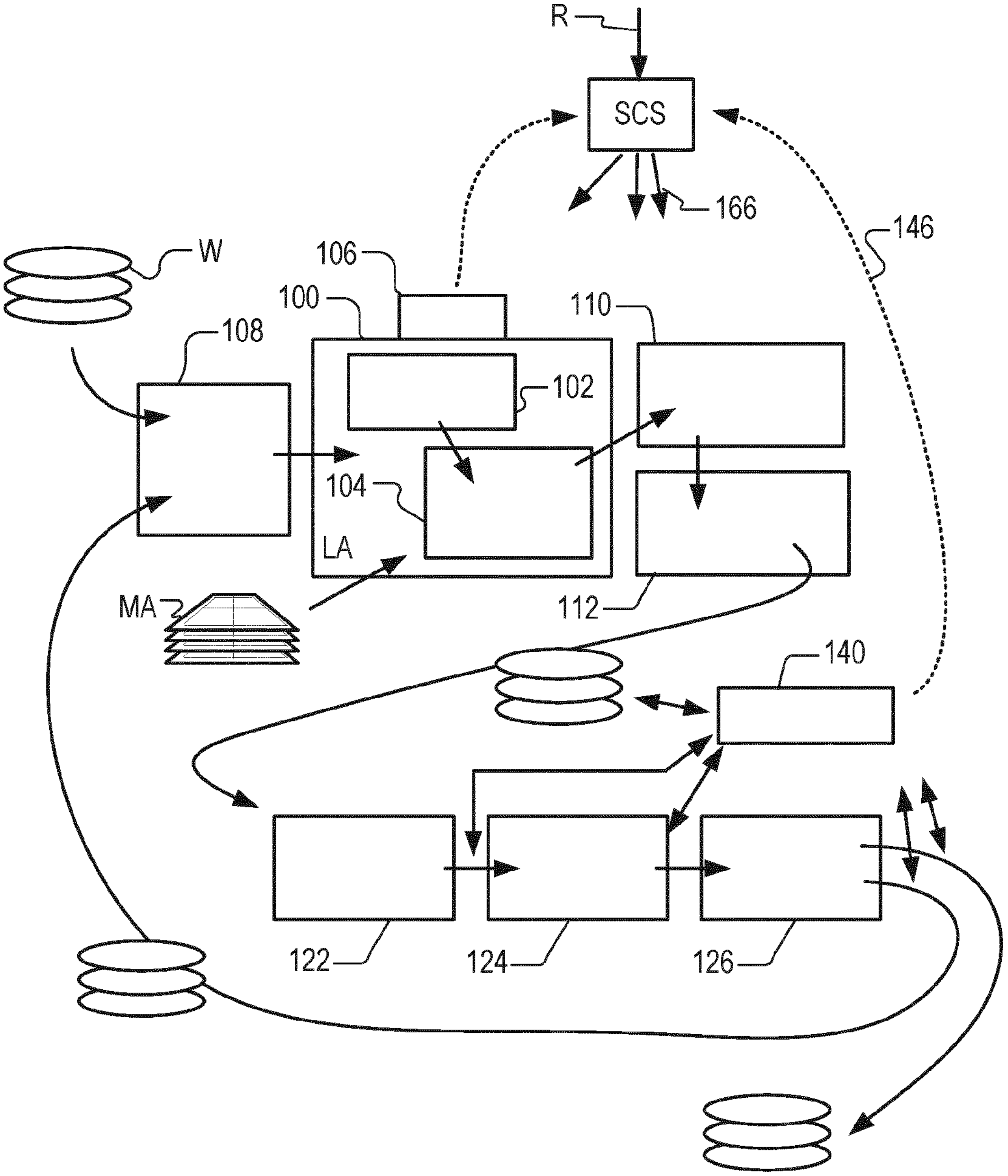
FIG. 1 depicts a lithographic apparatus together with other apparatus forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. . . . . The metrology apparatus is configured to inspect substrates after development (112) or after further processing (e.g. etching). The various apparatus within the litho cell are controlled by a supervisory control system SCS, which issues control signals 166 (which are shown by arrows coming out of the SCS in FIG. 1) to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The APC process applies correction in a feedback loop. The APC corrections are set of k-parameters defined per field of each substrate, i.e. wafer, within a lot. The k-parameters are associated with polynomial base functions which parameterize the distortion of the imaging across the field of each substrate. For example each k-parameter could describe a certain image distortion component like one or more of: scaling error, barrel distortion, pincushion distortion, etc.

The k-parameters are also used as input to the lithographic system (scanner) to correct the distortion. Accordingly:

Wafer_1 (field_1: k1-kn, field_2: k1-kn, etc), Wafer_2 (field_1: k1-kn, field_2: k1-kn, etc), etc.

Each k-parameter is communicated to the control interface of the scanner and subsequently used to control/configure an associated part of the scanner (e.g. lens, wafer stage, reticle stage).

In known systems, the control interface is purely based on a polynomial base function based representation of control parameter data (such as overlay data and alignment data). However for high frequent control parameter data this would require the use of (very) high order polynomial base functions (for example having an order larger than 5 across the field) leading to large oscillations of the base function representation of the control parameter data at positions for which no data is available. Often this oscillatory behavior is referred to as “Runge’s effect” which prohibits the use of higher order polynomial base functions to represent data on a small spatial scale (high resolution).

It has been recognized that in such a case it is beneficial to use periodic base functions. By representing the control parameter data using periodic functions having different periods, all smaller than a dimension of the field, a high resolution control interface is provided which is not prone to Runge’s effect.

Preferably the periodic base functions are combined with lower order polynomial base functions to represent the control parameter data instead of using increasingly high order polynomial base function to keep up with increasingly higher resolution control interface requirements.

Typically both polynomial and periodic base functions are functions of an X and Y coordinate associated with dimensions of the field. The field dimensions are normally different in X and Y and also the control characteristics of the lithographic apparatus differ between the two coordinates. In view of the latter the utilized periodic and polynomial base functions may have different periods/frequencies and polynomial orders for the X respectively Y coordinate. For example the maximum order may be 4 in X and 5 in Y and the number of periods associated with the periodic base function periods may vary between 2 and 4 in X and 3 and 5 in Y. Of course the exact configuration of maximum and minimum polynomial order and period/frequency may be brought in line with field dimensions and/or control characteristics of the lithographic apparatus.

Figures 2, 3:
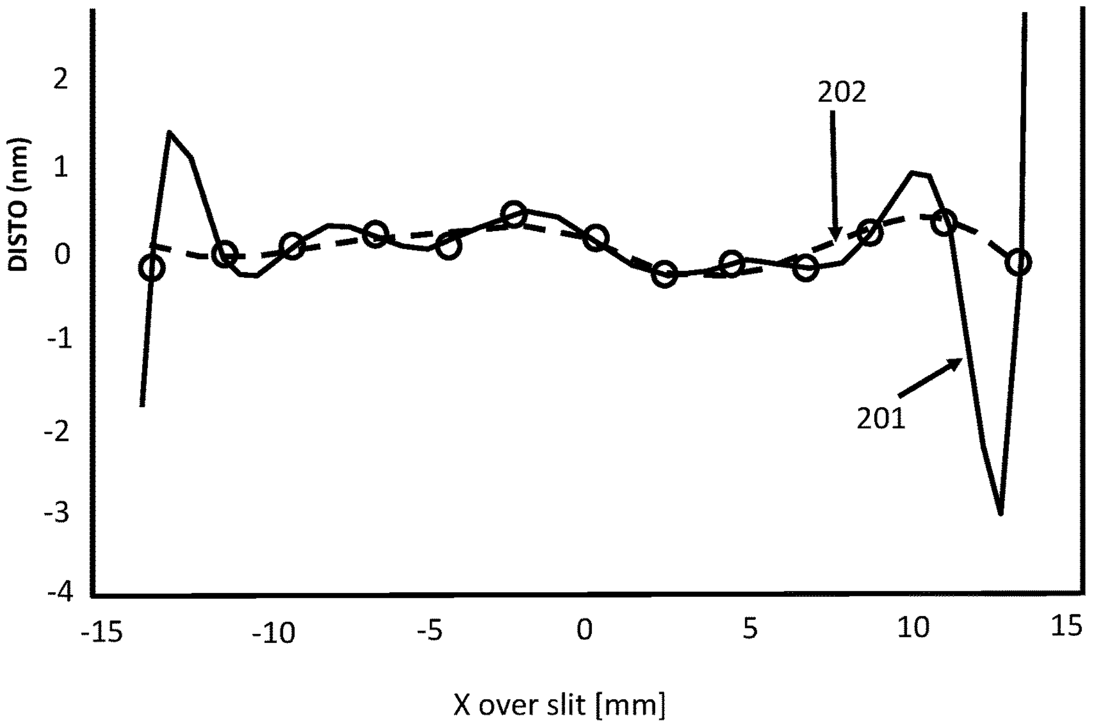
FIG. 2 depicts a representation of control parameter data
FIG. 3 shows an example matrix of values associated with a control parameter representation according to an embodiment.

In FIG. 2 an example is given of an embodiment of the invention. A distortion control parameter “disto” data set is obtained; the “disto” parameter is measured as a function of the x-coordinate (which is parallel to a slit projected to the substrate by the lithographic apparatus). A traditional representation of the “disto” parameter using higher order polynomial base functions (associated with k-parameters) is demonstrated by curve 201, clearly the oscillatory behavior between measurement points is visible. The curve 202 demonstrates the obtained representation of the “disto” parameter in case of using a combined set of periodic (sine) and polynomial (lower order) base functions. Clearly the representation 202 follows the measurement points very well, while not demonstrating any oscillatory behavior (Runge’s effect).

In an embodiment a method for representing control parameter data for controlling a lithographic apparatus is provided, the method comprising: obtaining a set of periodic base functions, each base function out of said set of periodic base functions having a different frequency and a period smaller than a dimension associated with an exposure field of a substrate across which the lithographic apparatus needs to be controlled; obtaining the control parameter data; and determining a representation of said control parameter data using the set of periodic base functions.

By representing the control parameter data using periodic functions having different periods and/or frequencies, the periods being smaller than a dimension of the field a high resolution control interface is provided which is not prone to Runge’s effect.

In an embodiment the representation of the control parameter data may be further used to configure or control the lithographic apparatus, for example by generating a control recipe comprising factors with which each of the set of periodic and polynomial base functions needs to be multiplied in order to represent the control parameter data accurately.

In an embodiment the method further comprises obtaining a set of polynomial base functions, each polynomial base function having an order lower than required to represent the control parameter data and further using said set of polynomial base functions together with said set of periodic base function in determining the representation of the control parameter data.

In an embodiment the set of periodic base functions are all based on a sine function defined across the exposure field of the substrate.

In an embodiment the set of polynomial base functions are associated with combinations of polynomials associated with k-parameters.

In FIG. 3 an example is given of a matrix of values associated with the control interface according to an embodiment of the invention. For example the control parameter may be overlay in X or Y direction; each control parameter having its own control interface parameters associated with its corresponding set of periodic and polynomial based functions used to represent the control parameter data.

FIG. 3 shows that for overlay X the set of polynomial base functions is of $4^{th}$ order in X coordinate and of $5^{th}$ order in the Y-coordinate, while the periodic base functions have a frequency of repetition between 2 and 4 cycles per field in the X coordinate and between 2.5 and 3.5 cycles per field in the Y-coordinate. For the overlay Y coordinate another control interface parameterization is chosen regarding its periodic base function definition in line with the different field dimensions and/or control characteristics of the lithographic apparatus in the Y direction (scan direction) compared to the X direction (slit direction).

In an embodiment the set of periodic base functions are defined as two-dimensional functions in a first (X) and a second (Y) coordinate of the exposure field on the substrate.

In an embodiment the set of periodic base functions comprise at least a first sine function having a period in the first coordinate which is half the dimension of the exposure field in the first coordinate and a period in the second coordinate which is 40% of the dimension of the exposure field in the second coordinate.

In an embodiment the set of periodic base functions comprise at least a second sine function having a period in the first coordinate which is one quarter of the dimension of the exposure field in the first coordinate and a period in the second coordinate which is about 30% of the dimension of the exposure field in the second coordinate.

In an embodiment the set of polynomial base functions have a maximum order of 4 in the first coordinate and a maximum order of 5 in the second coordinate.

In an embodiment the combined set f(x) of periodic and polynomial base functions associated with the first coordinate is represented by the following formula:

$$f(x)=c_0+c_1x^1+c_2x^2+c_3x^3+c_4x^4-c_5\sin(2\pi(1-x))-c_6\sin(2.5\pi(1-x))-c_7\sin(3\pi(1-x))-c_8\sin(3.5\pi(1-x))-c_9\sin(4\pi(1-x)),$$

wherein c0-c9 are the control interface parameters associated with the first coordinate. The first coordinate ‘x’ being normalized to a range of [−1,1] across the full dimension of the field along said first coordinate.

In an embodiment the combined set f(y) of periodic and polynomial base functions associated with the second coordinate is represented by the following formula:

$$f(y)=c'_0+c'_1y^1+c'_2y^2+c'_3y^3+c'_4y^4+c'_5y^5-c'_6\sin(2.5\pi(1-y))-c'_7\sin(3\pi(1-y))-c'_8\sin(3.5\pi(1-x)).$$

wherein c'0-c'8 are the control interface parameters associated with the second coordinate. The second coordinate ‘y’ being normalized to a range of [−1,1] across the full dimension of the field along said second coordinate.

Typically the first coordinate ‘x’ is associated with a direction perpendicular to a direction of scanning performed by the lithographic apparatus and the second coordinate ‘y’ is associated with the direction of scanning.

In an embodiment there is provided a device manufacturing method comprising: representing the control parameter data according to the method of any previous embodiment and subsequently controlling the lithographic apparatus during patterning the exposure field of the substrate using said representation of the control parameter data.

In an embodiment there is provided a computer program that, when executed by a computing system, causes the computing system to perform the method of any previous embodiment.

In an embodiment there is provided a computer readable medium carrying instructions that, when executed by a computing system, causes the computing system to perform the method of any previous embodiment.

In an embodiment there is provided a lithographic apparatus configured to implement the method of any previous embodiment.

The terms “radiation” and “beam” used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term “lens”, where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for representing control parameter data for controlling a lithographic apparatus during a scanning exposure of an exposure field on a substrate, the method comprising:

obtaining a set of periodic base functions, each base function out of the set of periodic base functions having a different frequency and a period smaller than a dimension associated with the exposure field across which the lithographic apparatus needs to be controlled;

obtaining the control parameter data; and determining, by a hardware computer, a representation of the control parameter data using the set of periodic base functions.

2. The method of claim 1, wherein the representation of the control parameter data is further used to configure or control the lithographic apparatus.

3. The method of claim 1, further comprising obtaining a set of polynomial base functions, each polynomial base function having an order lower than required to represent the control parameter data and further using the set of polynomial base functions together with the set of periodic base functions in determining the representation of the control parameter data.

4. The method of claim 3, wherein the set of polynomial base functions are associated with k-parameters.

5. The method of claim 3, wherein the set of polynomial base functions have a maximum order of 4 in a first coordinate and a maximum order of 5 in a second coordinate.

6. The method of claim 3, wherein the combined set f(x) of periodic and polynomial base functions associated with a first (x) coordinate is represented by the following formula:

$$f(x)=c_0+c_1x^1+c_2x^2+c_3x^3+c_4x^4-c_5\sin(2\pi(1-x))-c_6\sin(2.5\pi(1-x))-c_7\sin(3\pi(1-x))-c_8\sin(3.5\pi(1-x))-c_9\sin(4\pi(1-x)),$$

wherein c0-c9 are control interface parameters associated with the first coordinate.

7. The method of claim 3, wherein the combined set f(y) of periodic and polynomial base functions associated with a second (y) coordinate is represented by the following formula:

$$f(y)=c'_0+c'_1y^1+c'_2y^2+c'_3y^3+c'_4y^4+c'_5y^5-c'_6\sin(2.5\pi(1-y))--c'_7\sin(3\pi(1-y))-c'_8\sin(3.5\pi(1-y)),$$

wherein c'0-c'8 are control interface parameters associated with the second coordinate.

8. The method of claim 1, wherein the set of periodic base functions are all based on a sine function defined across the exposure field.

9. The method of claim 1, wherein the set of periodic base functions are defined as two-dimensional functions in a first (X) and a second (Y) coordinate of the exposure field on the substrate.

10. The method of claim 9, wherein the set of periodic base functions comprise at least a sine function having a period in the first coordinate which is half the dimension of the exposure field in the first coordinate and a period in the second coordinate which is about 40% of the dimension of the exposure field in the second coordinate.

11. The method of claim 9, wherein the set of periodic base functions comprise at least a sine function having a period in the first coordinate which is one quarter of the dimension of the exposure field in the first coordinate and a period in the second coordinate which is about 30% of the dimension of the exposure field in the second coordinate.

12. A lithographic apparatus configured to implement the method of claim 1.

13. A device manufacturing method comprising:

representing the control parameter data according to the method of claim 1; and subsequently controlling the lithographic apparatus during patterning the exposure field of the substrate using the representation of the control parameter data.

14. A non-transitory computer readable medium carrying instructions that, when executed by a computing system, are configured to cause the computing system to at least:

obtain a set of periodic base functions, each base function out of the set of periodic base functions having a different frequency and a period smaller than a dimension associated with an exposure field across which a lithographic apparatus needs to be controlled;

obtain control parameter data for controlling the lithographic apparatus during a scanning exposure of the exposure field on a substrate; and determine a representation of the control parameter data using the set of periodic base functions.

15. The medium of claim 14, wherein the instructions are further configured to cause configuration or control of the lithographic apparatus based on the representation of the control parameter data.

16. The medium of claim 14, wherein the instructions are further configured to obtain a set of polynomial base functions, each polynomial base function having an order lower than required to represent the control parameter data and wherein the instructions configured to determine the representation of the control parameter data are configured to determine the representation of the control parameter data using the set of polynomial base functions together with the set of periodic base functions.

17. The medium of claim 16, wherein the set of polynomial base functions have a maximum order of 4 in a first coordinate and a maximum order of 5 in a second coordinate.

18. The medium of claim 14, wherein the set of periodic base functions are all based on a sine function defined across the exposure field.

19. The medium of claim 14, wherein the set of periodic base functions are defined as two-dimensional functions in a first (X) and a second (Y) coordinate of the exposure field on the substrate.

20. The medium of claim 19, wherein the set of periodic base functions comprise at least a sine function having a period in the first coordinate which is half the dimension of the exposure field in the first coordinate and a period in the second coordinate which is about 40% of the dimension of the exposure field in the second coordinate or comprise at least a sine function having a period in the first coordinate which is one quarter of the dimension of the exposure field in the first coordinate and a period in the second coordinate which is about 30% of the dimension of the exposure field in the second coordinate.

* * * * *